United States Patent [19]

Kusumi

[11] 4,199,797
[45] Apr. 22, 1980

[54] PROTECTIVE CIRCUIT FOR AMPLIFIER CIRCUITS

[75] Inventor: Jiro Kusumi, Yokohama, Japan

[73] Assignee: Tokyo Shibaura Electric Co., Ltd., Japan

[21] Appl. No.: 865,868

[22] Filed: Dec. 30, 1977

[30] Foreign Application Priority Data

Jan. 14, 1977 [JP] Japan ............................. 52-2491[U]

[51] Int. Cl.² ............................................. H02H 3/22
[52] U.S. Cl. .................................. 361/56; 330/207 P
[58] Field of Search ............ 330/207 P, 298; 361/56, 361/90, 91, 111, 18

[56] References Cited

U.S. PATENT DOCUMENTS

| | | | |
|---|---|---|---|
| 3,449,598 | 6/1969 | Wright | 361/56 X |
| 3,564,338 | 2/1971 | Teshirogi et al. | 361/91 X |
| 3,858,088 | 12/1974 | Scarpino et al. | 361/91 X |
| 4,005,342 | 1/1977 | Davis | 361/91 |

*Primary Examiner*—Harry E. Moose, Jr.
*Attorney, Agent, or Firm*—Finnegan, Henderson, Farabow, Garrett & Dunner

[57] ABSTRACT

A bias circuit including a resistor and a zener diode connected in series between a terminal to be connected to a power source and a ground becomes conductive when a voltage difference across the terminal and ground exceeds a predetermined value to make protective transistors conductive. Upon conduction of the protective transistors, transistors in an amplifier circuit become nonconductive.

3 Claims, 3 Drawing Figures

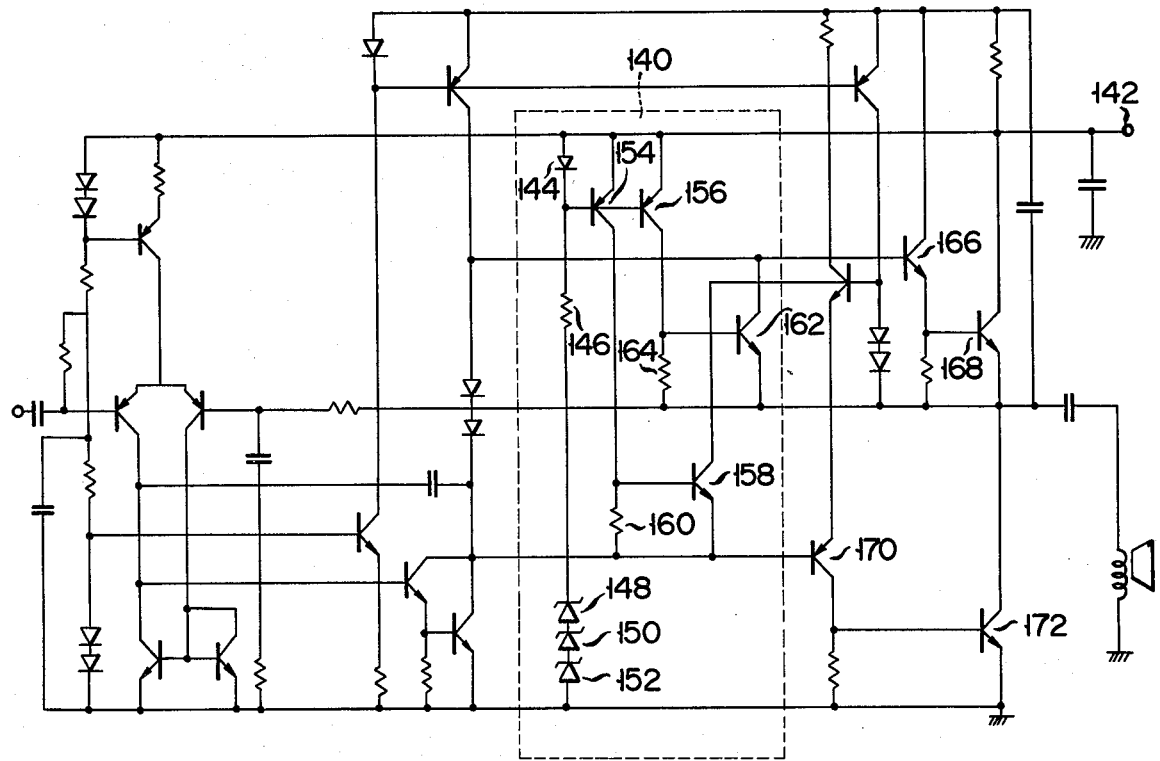
F I G. 3

PROTECTIVE CIRCUIT FOR AMPLIFIER CIRCUITS

BACKGROUND OF THE INVENTION

The present invention relates to a protective circuit for preventing an amplifier circuit from being destroyed.

When various amplifier circuits, particularly power amplifier circuits in audio apparatus are subject to an excessively boosted voltage of a power source, the components of the circuits may possibly be damaged or destroyed. Some proposals have been made to protect the circuit from such damage.

Referring now to FIG. 1, there is shown an amplifier circuit into which a conventional protective circuit is incorporated. Reference numeral 2 designates a preamplifier. Numeral 4 denotes a power amplifier. Numeral 6 designates a protective circuit for protecting the power amplifier stage from being damaged or destroyed. Numeral 8 is a load such as a speaker and numerals 10, 12, 14 and 16 are DC blocking capacitors for blocking DC components from passing. Assume that a power voltage $V_{CC}$ is excessively boosted and zener diode 18 becomes conductive. In this case, current passes through resistors 20 and 22 so that a potential difference appears across resistors 20 and 22. When the potential difference across the resistor 22 reaches a threshold voltage between the base-emitter of a transistor 24, the transistor 24 is turned on. The turning on of transistor 24 blocks the input signal delivered through the capacitor 12 from going to the power amplifier 4. That is, the input signal flows to ground through the collector-emitter path of the turned-on transistor 24. In this manner, the transfer of the input signal to the power amplifier stage 4 is blocked when power source voltage is raised too high. As a result, destruction of the power amplifier 4 is prevented when there is excessive boosting of power source voltage.

As described and shown, the protective circuit 6 is connected to the power amplifier circuit 4, through the blocking capacitor 14. Therefore, it is impossible to instantaneously eliminate the input signal. In consequence, it frequently fails to protect the power amplifier circuit 4 when the power source voltage is rapidly raised.

Further, it is impossible to eliminate the collector current flowing into the output transistor of the power amplifier 4, when no input signal is present. Even if the power source voltage is gently raised, there is a possibility that the transistor 24 will consume an excessive power expressed by the product of the collector current flowing at no input signal and the power source voltage.

SUMMARY OF THE INVENTION

With a view to overcoming the above-mentioned disadvantages, the present invention provides a protective circuit in which an input signal to a power amplifier circuit is instantaneously reduced to zero at rapid boosting of the power source voltage and the collector current flowing into the amplifying transistor in the power amplifier circuit is eliminated at no input signal, whereby the power amplifier circuit is protected from being damaged or destroyed.

BRIEF DESCRIPTION OF THE DRAWING

FIG. 3 shows a circuit diagram of a push-pull power amplifier in which another protective circuit according to the present invention is incorporated.

DESCRIPTION OF THE PREFERRED EMBODIMENTS

Figure 1:
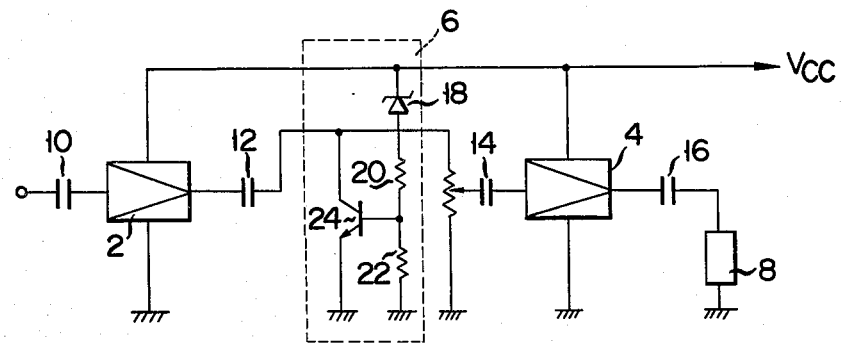
FIG. 1 shows amplifier circuit including a conventional protective circuit.
Figure 2:
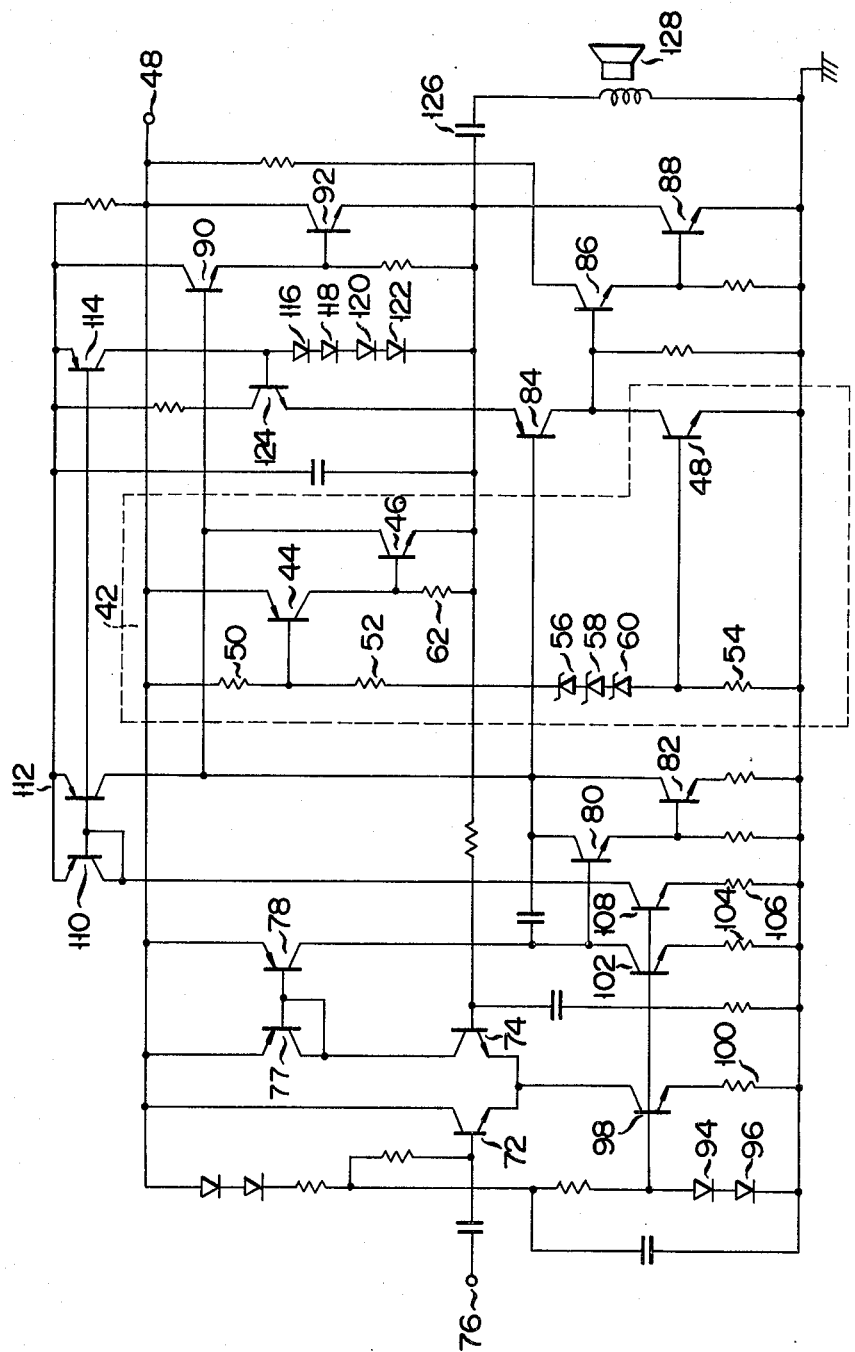
FIG. 2 shows a circuit diagram of a push-pull power amplifier in which a protective circuit according to the present invention is incorporated.

A preferred embodiment of a protective circuit according to the present invention will be described with reference to FIG. 2 illustrating a circuit diagram with a protective circuit incorporated into an amplifier circuit. The protective circuit designated by numeral 42 and enclosed by a dotted line comprises three transistors 44, 46 and 48, resistors 50, 52 and 54 connected in series between a terminal 48 coupled with a power source voltage $V_{CC}$ and ground, Zener diodes 56, 58, 60, and a bias resistor 62. The series connection of Zener diodes 56, 58 and 60 is connected at the cathode of Zener diode 56 to the power source and at the anode of Zener diode 60 to ground.

Transistors 72 and 74 constitute a differential amplifier with an input terminal 76. Transistors 77 and 78 and transistors 80 and 82 constitute amplifiers, respectively, which amplify an output signal from the differential amplifier. Transistors 84, 86 and 88 and transistors 90 and 92 constitute a push-pull power amplifying circuit. The negative component of the output signal from the transistor 82 is amplified by transistors 84, 86 and 88 and the positive component thereof is amplified by transistors 90 and 92. Diodes 94 and 96, a transistor 98 and a resistor 100 constitute a constant current source of a differential amplifier comprised of the transistors 72 and 74. A transistor 102, a resistor 104 and diodes 94 and 96 constitute a constant current source for the amplifier circuit comprised of the transistors 76 and 78. A resistor 106, transistors 108, 110 and 112 form a constant current circuit for an amplifier circuit comprised of transistors 80 and 82. Transistors 110 and 114 form a constant current source for diodes 116, 118, 120 and 122. The transistor 124 sets up a proper bias to the transistors 84 and 90 to eliminate a crossover distortion. A speaker 128 is connected between ground and a capacitor 126 for blocking DC current.

The following explanation is of the circuit construction of the protective circuit 42. As shown, resistors 50 and 52, Zener diodes 56, 58 and 60 and a resistor 54 are connected in series in this order between the terminal 48 and ground. The number of Zener diodes is not limited to three as in this example, but any suitable number of Zener diodes may be used, if necessary. The PNP transistor 44 is connected at the emitter to the power source side of the resistor 50 and at the base to the ground side of the same. The collector of the transistor 44 is connected to the base of the NPN transistor 46. The transistor 46 is connected at the collector to the base of the transistor 90 and at the emitter to the emitter of the transistor 92. The base of the NPN transistor 48 is connected to the connection point of the resistor 54 and the Zener diode 60. The collector of the transistor 48 is connected to the base of the transistor 86. The transistor 48 is further connected at the emitter to ground. A bias resistor 62 is connected across the base-emitter path of the transistor 46.

Assume now that the power source voltage $V_{CC}$ is raised to an excessive value and the Zener diodes 56, 58 and 60 are conductive. Under this condition, current flows through resistors 50, 52 and 54 so that potential differences appear across the respective resistors. When the potential difference across the resistor 50 reaches the threshold voltage across the base-emitter path of the transistor 44, the transistor becomes conductive. Upon the conduction of the transistor 44, a potential difference is produced across the resistor 62 so that the transistor 46 is turned on, and thus the transistors 90 and 92 are turned off. When the potential difference across the resistor 54 reaches the threshold voltage across the base-emitter path of the transistor 48, the transistor 48 is turned on, and thus the transistors 86 and 88 are turned off.

As described above, when the power source voltage is excessively raised, the output transistors 86, 88, 90 and 92 of the power amplifier circuit to be protected are instantaneously turned off. For this, even in a rapid boosting of the power source voltage, the protection of the power source voltage is ensured. Additionally, the output transistors of the power amplifier circuit are turned off so that there is no collector current at no input signal. Accordingly, the output transistors consume no power relating to such collector current.

Turning to FIG. 3, there is shown another embodiment of the protective circuit of the present invention incorporated into a power amplifier circuit similar to the FIG. 2 amplifier circuit.

For ease of explanation, reference numerals are attached to only the necessary portions of the circuit. As shown, a protective circuit 140 enclosed by a dotted line has a series circuit including a diode 144, a resistor 146, and Zener diodes 148, 150, and 152 connected in this order between the terminal 142 for the power source voltage $V_{CC}$ and ground. The diode 144 is connected at the anode side to the power source and at the cathode side to ground. A series of Zener diodes 148, 150 and 152 are connected at the cathode side to the power source side and at the anode side to ground. The diode 144 is further connected at the anode to the emitters of the transistors 154 and 156 and at the cathode to the bases of the transistors 154 and 156. The collector of the transistor 154 is connected to the base of the NPN transistor 158. The base bias resistor 160 is connected between the base of the transistor 158 and the emitter thereof. The collector of the transistor 156 is connected to the base of the NPN transistor 162. A resistor 164 is connected between the base and emitter of the transistor 162.

A power source amplifier circuit comprises a push-pull amplifier circuit including transistors 166, 168, 170 and 172. The NPN transistor 162 of the protective circuit is connected at the collector to the base of the NPN transistor 166 and at the emitter to the emitter of the NPN transistor 168. The emitter of the NPN transistor 158 is connected to the base of the PNP transistor 170. The operation of the circuit when the power source voltage is raised is similar to the FIG. 2 embodiment. When the power source voltage is excessively raised, current flows through the diode 144, the resistor 146, and Zener diodes 148, 150 and 152. The potential difference across the diode 144 due to the excessive boosting of the power source voltage reaches the threshold voltage across the base-emitter paths of the transistors 154 and 156. At this time, the transistors 154 and 156 are turned on. When the transistors 154 and 156 are turned on, the transistors 158 and 162 are also turned on. Then, the transistors 166 and 168 are turned off and the transistors 170 and 172 are also turned off. Therefore, the collector current, i.e., the output current, flowing through these transistors 166, 168, 170 and 172 is zero. Consequently, this example attains similar effects to that obtained by the FIG. 2 example.

What is claimed is:

1. A protective circuit for protecting an amplifier circuit including at least one transistor having a base supplied with the output signal of the protective circuit comprising:

a plurality of transistors for controlling the at least one transistor; and a bias circuit including at least one resistive means and at least one Zener diode, which are connected in series between a power source terminal and ground, said bias circuit setting up a proper bias for said plurality of transistors; said at least one resistive means being connected to ground across the base-emitter of at least one of said plurality of said transistors; wherein said Zener diode is so connected as to be conductive when the power source voltage exceeds a predetermined value, and conduction of said Zener diode produces a voltage drop across said resistive means and the voltage drop makes said at least one transistor nonconductive.

2. A protective circuit for protecting a push-pull circuit having a first transistor combination including first input and output transistors and a second transistor combination including second input and output transistors, comprising:

a bias circuit including first resistive means, at least one Zener diode and a second resistive means connected in series between a power source terminal and ground, said Zener diode being so connected as to be conductive when the power source voltage exceeds a predetermined value; and first, second and third protective transistors, said first protective transistor having an emitter connected to the power source terminal side of said first resistive means, a base connected to the ground side of said first resistive means, and a collector, said second protective transistor having a collector to be connected to the base of said first input transistor of said push-pull amplifier circuit, an emitter connected to the emitter of said first output transistor and a base connected to the collector of said first protective transistor, said third protective transistor having a collector connected to the base of said second input transistor, an emitter connected to the emitter of said second output transistor, and a base connected to the connecting point of said Zener diode and said second resistive means.

3. A protective circuit for protecting a push-pull amplifier circuit having a first transistor combination including first and second input transistors, a second transistor combination including second input and output transistors and a third series transistor having an emitter connected to the emitter of the second input transistor and a collector connected to the collector of the first input transistor through an resistor means, comprising:

a bias circuit including a diode, a first resistive means, and at least one Zener diode connected in series between a power source terminal and ground, said Zener diode being so connected as to be conductive when the power source voltage exceeds a predetermined value, said diode being connected at the anode to the power source side and at the cathode to ground; and first, second, third and fourth protective transistors, said first and second protective transistors having emitters connected to the anode of said diode, bases connected to the cathode to said diode, and collectors, respectively, said third protective transistor having a collector to be connected to the base of said first input transistor, emitter connected to the emitter of said first output transistor and a base connected to the collector of said first protective transistor, said fourth protective transistor having a collector connected to the collector of said third series transistor, an emitter connected to the base of said second input transistor, and a base connected to the collector of said second protective transistor.

* * * * *